United States Patent [19]

Yokogawa

[11] Patent Number: 5,065,384
[45] Date of Patent: * Nov. 12, 1991

[54] CLOCK SIGNAL GENERATING CIRCUIT FOR A DATA STORING AND REPRODUCING SYSTEM

[75] Inventor: Fumihiko Yokogawa, Saitama, Japan

[73] Assignee: Pioneer Electronic Corporation, Tokyo, Japan

[*] Notice: The portion of the term of this patent subsequent to Oct. 3, 2006 has been disclaimed.

[21] Appl. No.: 280,042

[22] Filed: Dec. 5, 1988

[30] Foreign Application Priority Data

Dec. 17, 1987 [JP] Japan .................................. 62-319563

[51] Int. Cl.$^5$ .............................................. G11B 5/76
[52] U.S. Cl. ...................................... 369/47; 369/59; 360/37.1; 375/113; 331/15
[58] Field of Search ............... 360/37.1, 27, 28, 36.2; 369/47, 59; 331/15, 14, 17, 18, 25, 27; 375/111, 113, 120; 358/324, 326

[56] References Cited

U.S. PATENT DOCUMENTS 4,596,963  6/1986  Lawton et al. ........................ 331/14
4,872,155  3/1988  Yokogawa et al. ................... 369/59

Primary Examiner—Roy N. Envall, Jr.
Assistant Examiner—Hindi Nabil
Attorney, Agent, or Firm—Sughrue, Mion, Zinn, Macpeak & Seas

[57] ABSTRACT

A clock signal producing circuit for a data storing and reproducing system in which a reference clock signal having a predetermined frequency is generated, a first sync-signal detection signal is generated when the time between two adjacent pulses in the input signal which is measured by the reference clock signal becomes equal to the predetermined reference value, the clock edge pulse is separated from the input signal using the first sync-signal detection signal and then outputted, and a reproducing clock signal having a predetermined frequency coinciding with the generating timing of the separated clock edge pulse is generated.

3 Claims, 5 Drawing Sheets

CLOCK SIGNAL GENERATING CIRCUIT FOR A DATA STORING AND REPRODUCING SYSTEM

BACKGROUND OF THE INVENTION

The present invention relates to a clock signal producing circuit for a data storing and reproducing system, and more particularly to a clock signal producing circuit for producing a clock signal for a data storing and reproducing system according to a sampled format method.

A DRAW (Direct Read After Write) optical disk for example, stores servo bytes as shown in FIG. 3. Each sector of the optical disk is formed of forty-three servo blocks, each block having a servo byte of two bytes followed by a data-byte of 16 bytes. The servo byte includes two wobbled pits and one clock pit. The wobbled pits are disposed on both sides of a track center. When the information-detecting point of a pickup (light spot for detecting information) moves onto the track center, the decreases in the amount of light reaching the wobbled pits on bothsides become equal. When the information-detecting point of the pickup is displaced laterally, the decreases in amount of light reaching the two wobbled pits vary in accordance with the direction and amount of the displacement. Therefore, a tracking error signal is produced based on the difference (difference in an RF signal level) between the decrease in the amount of light at the two locations. This tracking error signal is maintained during a subsequent data byte section. In addition, the two wobbled pits alternately form a long section and a short section every 16 tracks. By detecting alternation of these long and short sections, it is possible to count the number of tracks even when searching at high speed (16 track counting). Further, a distance D between the wobbled pit and the subsequently located clock pit is set to a predetermined length, which does not appear in the data bytes. Thus the distance D can be detected as a synchronous signal. Various timing signals are produced on the basis of this detected synchronous signal. The clock signal is produced in accordance with the detection of the clock pit. A mirror plane at a distance D is used as a focus area where a focus error signal is detected and is maintained during a subsequent data byte section.

When a DRAW disk of, for example 5 inches in which a servo byte thus described is stored, is caused to rotate at a rate of 1800 rpm, the edge produced in the RF signal due to the clock pit will occur at a frequency of 41.28 kHz.

FIG. 4 shows an example of a clock producing circuit for producing a clock signal to enable the reproduction of data which have been stored after the servo byte on such DRAW disks. In FIG. 4, the RF signal obtained from a disk (not shown) by means of a pickup 1 is amplified by a head amplifier 2 and then is supplied to a differentiation edge detection circuit 3. The differentiation edge detection circuit 3 is arranged to output edge pulses which are a train of pluses corresponding to the respective detected signal-edge which is obtained by differentiating the RF signal. The edge pulses a which are output from the circuit 3, are supplied to a synchronism detection circuit 4 and to one of the input terminals of an AND gate 5. The synchronism detection circuit 4 is supplied with a reproducing clock signal from a PLL (Phase Locked Loop) circuit 6. The synchronism detection circuit 4 measures the period between two successive pulses in the train of edge pulses a by counting the reproducing clock signal pulses and then outputs a sync-signal detection signal b when the measured count of the reproducing clock signal pulses equals a predetermined value. The sync-signal detection signal b is supplied to a gate pulse generating circuit 7. The gate pulse generating circuit 7 is arranged to generate a clock gate pulse having a predetermined duration in a predetermined time after the sync-signal detection signal b has been output, on the basis of the reproducing clock signal pulses from the PLL circuit 7. The clock gate pulse from the gate pulse generating circuit 7 is supplied to the other input terminal of the AND gate 5.

The output of the AND gate 5 is supplied to a phase comparator circuit 8 of the PLL circuit 6. The phase comparator circuit 8 performs phase comparison between the output of the AND gate 5 and the output of a divider circuit 9 to supply the result of the phase comparison to a low pass filter 10 (referred to as LPF hereafter). The signal filtered out by the LPF 10 is supplied as a control voltage to a voltage controlled oscillator 11 (referred to as VCO hereafter). A reproducing clock signal (for instance, 11.1456 MHz having a phase in accordance with the control voltage is output from the VCO 11. The reproducing clock signal e is divided by 270 by the divider circuit 9, and is then supplied as a signal of 41.28 kHz to the phase comparator circuit 8.

In the arrangement thus described, when the light spot of the pickup 1 traces the servo byte, the level of the RF signal decreases at a pit location, thus the edge pulses as shown in FIG. 5(A) in accordance with the location of pits are output from the differentiation edge detection circuit 3. When the time between successive edge pulses a becomes equal to the time corresponding to the distance D, the sync-signal detection signal b is output. The gate pulse generating circuit 7 generates a gate pulse c as shown in FIG. 5(B) for gating a clock edge pulse generated in accordance with the clock pit, on the basis of the sync-signal detection signal b. Supplying the edge pulses a and the gate pulse c to the AND gate 5 causes the AND gate 5 to output only the clock edge pulse d corresponding to a clock pit as shown in FIG. 5(c), which is supplied to the phase comparator circuit 8 of the PLL circuit 6. As a result, the PLL circuit 6 generates the reproducing clock e of 11.1456 MHz in synchronism with the clock edge pulse d.

If a 5 inch DRAW disk is rotated at 1800 rpm, the frequency of the clock pit (clock edge pulse) will be 41.28 KHz. If the pulse length of the clock edge pulses is a half of the clock signal (approximately 45 ns), the energy distribution of the clock edge pulse will be as shown in FIG. 6 where the spectra appear intermittently at a spacing equal to the sampling frequency of 41.28 KHz, centered about the clock frequency of 11.1456 MHz. The spectra will be as shown in FIG. 7 when the pulse length of the clock edge pulse is varied. In a prior art clock producing circuit shown in FIG. 4, since the phase comparator circuit 8 compares the input signals of identical frequencies, there is no possibility that the PLL is mistakenly locked to 11.456 MHz ±41.28N KHz (N is an integer). However, there is a shortcoming in that due to the precision of the phase comparator circuit 8 equaling 1/270, jitter of the clock signal may be increased. Another problem is that stable detection of the syncsignal is not effected initially, thus requiring more time before the PLL is locked, since detection of the syncsignal is effected by the reproducing clock signal which is output from the PLL circuit 6 and also the sync-signal which produces a gate pulse to select the clock edge pulse d to be supplied to the PLL circuit 6.

SUMMARY OF THE INVENTION

The present invention was made to eliminate the aforementioned deficiencies, and it is an object of the invention to provide a clock signal producing circuit for a data storing and reproducing system. A clock signal producing circuit for a data storing and reproducing system according to the present invention is arranged in such a way that a reference clock signal having a predetermined frequency is generated; a first sync-signal detection signal is generated when the time between two adjacent pulses in the input signal which is measured by the reference clock signal becomes equal to the predetermined reference value; the clock edge pulse is separated from the input signal using the first syncsignal detection signal and then outputted; a reproducing clock signal having a predetermined frequency coinciding with the generating timing of the separated clock edge pulse is generated.

DETAILED DESCRIPTION OF THE PREFERRED EMBODIMENT

The present invention will now be described in greater detail with reference to FIG. 1 and FIG. 2.

Figure 1:
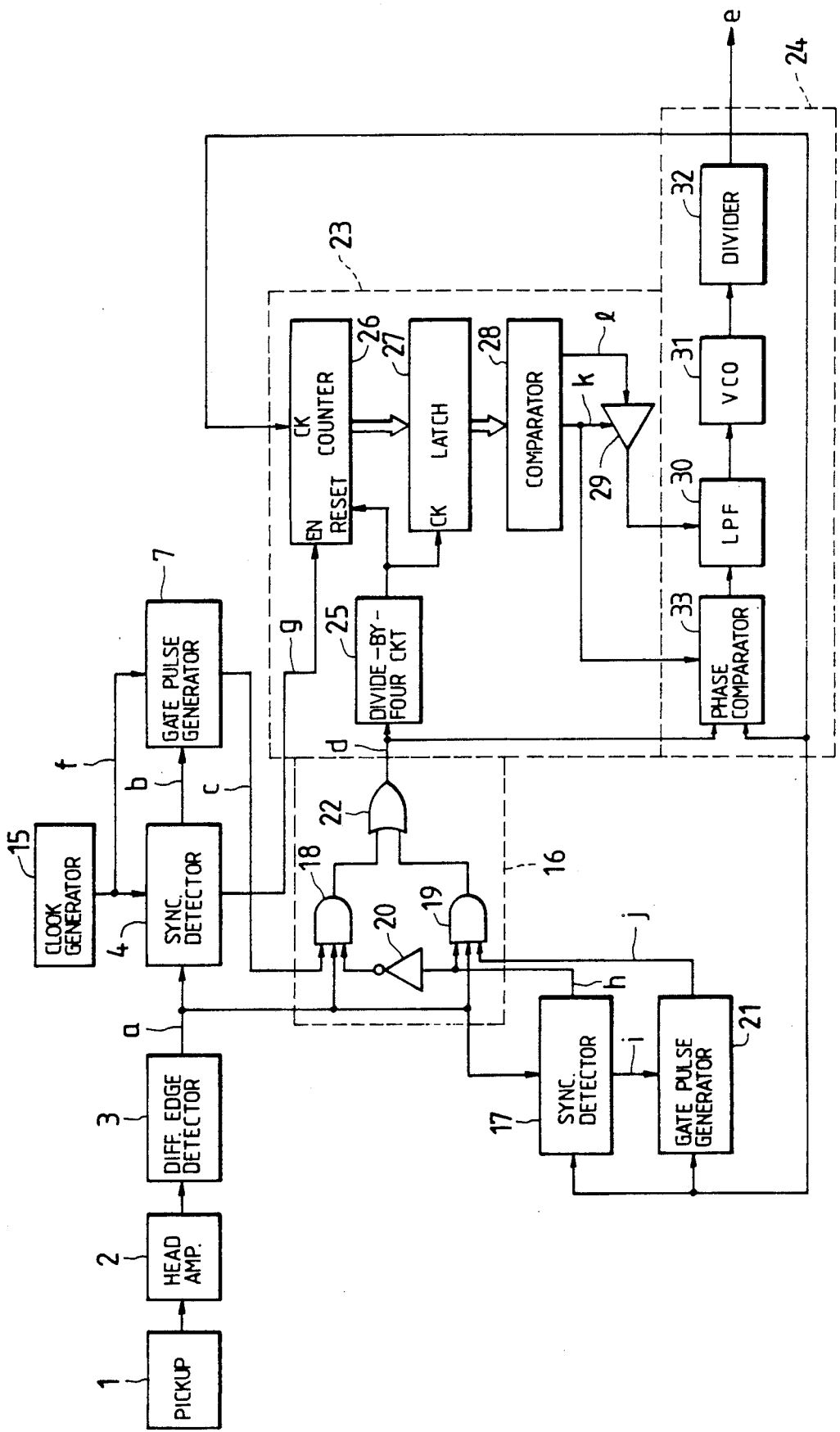
FIG. 1 is a circuit block diagram showing an embodiment of the present invention.
Figure 4:
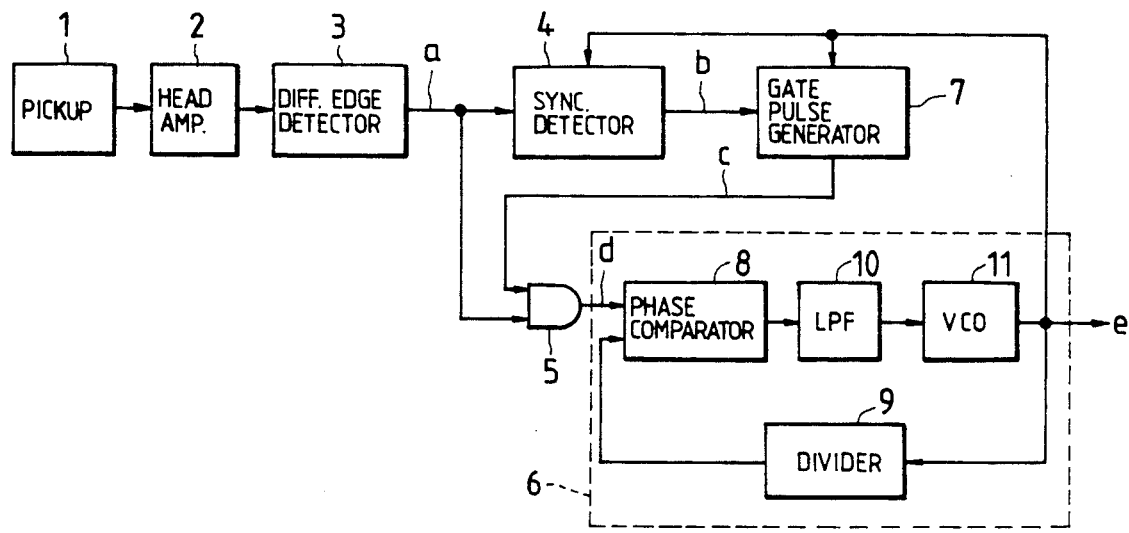
FIG. 4 is a clock diagram showing a prior art clock producing circuit.
Figure 5:
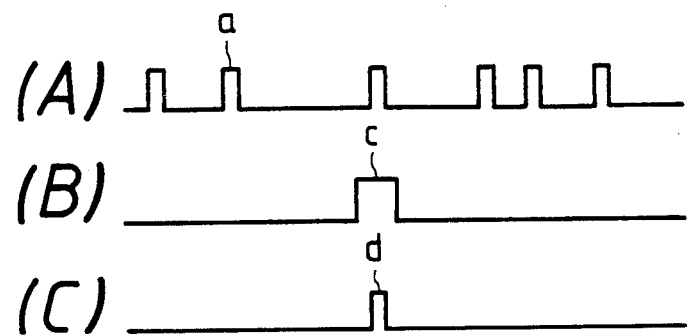
FIG. 5(A)-(C) are a timing charts showing operation of the circuit in FIG. 4.
Figure 6:
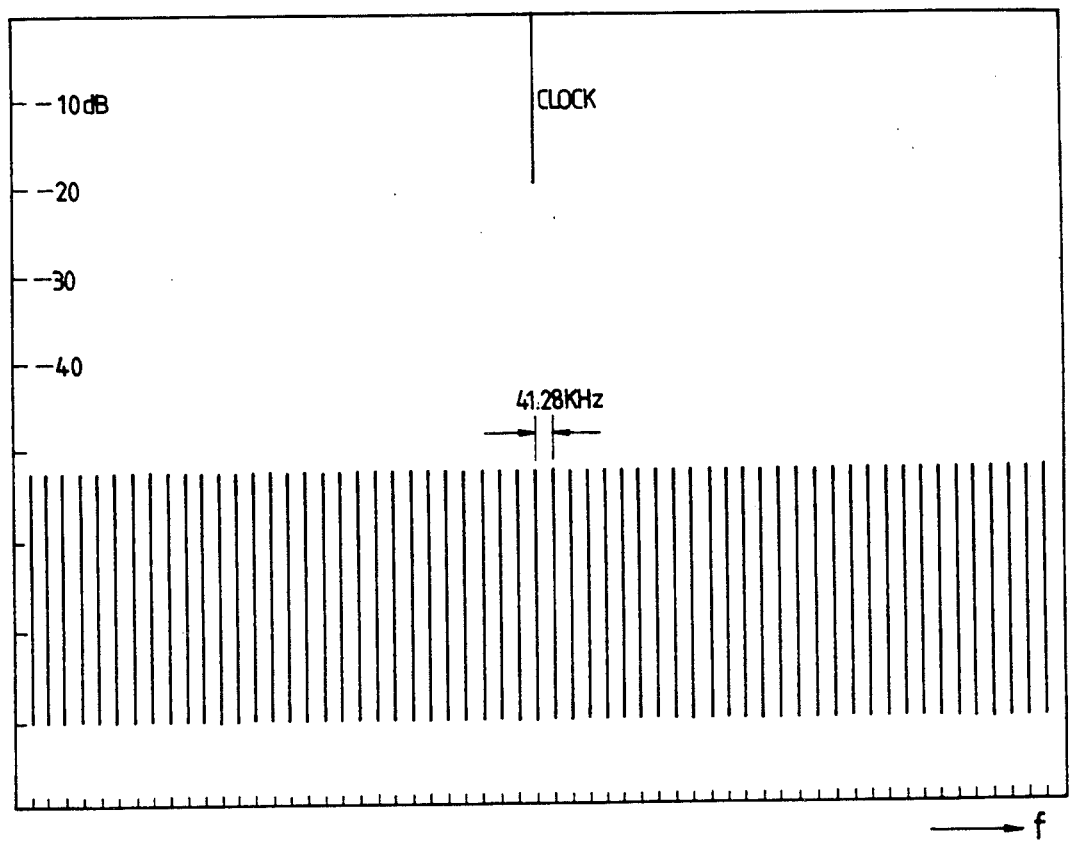
FIG. 6 and FIG. 7 are spectrum diagrams of clock edge pulses.
Figure 7:
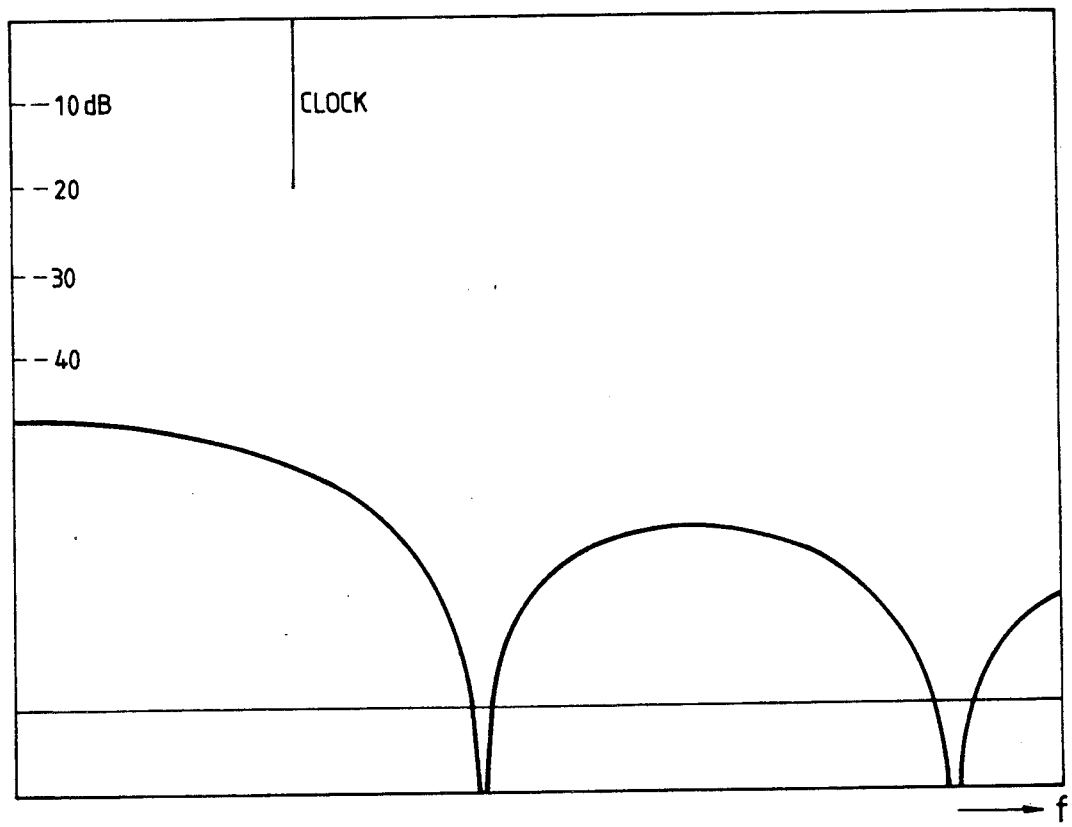

In FIG. 1, a pickup 1, a head amplifier 2, a differentiation edge detection circuit 3, a synchronism detection circuit 4, and a gate pulse generating circuit 7 are connected in a manner similar to FIG. 4, except that a master clock f is supplied to both the synchronism detection circuit 4 and the gate pulse generating circuit 7 from clock generating circuit 15 formed of, for example, a crystal oscillator. The synchronism detection circuit 4 also comprises, in addition to the arrangement in the circuit shown in FIG. 4, a circuit which outputs a synchronism completion signal when the sync-signal detection signal b-, which is output successively at a predetermined interval of time, reaches a predetermined value. The edge pulse which is output from the differentiation edge detection circuit 3 is supplied to the clock edge selecting circuit 16 and the synchronism detection circuit 17. In the clock edge selecting circuit 16, the edge pulse a is one of the input signals to 3-input AND gates 18 and 19. The AND gate 18 is supplied with a gate pulse c which is output from the gate pulse generating circuit 7 as well as a synchronism completion signal h which is output from the synchronism detection circuit 17 through an inverter 20. The synchronism completion signal h is supplied directly to 3-input AND gate 19. The AND gate 19 is supplied with a gate pulse i which is output from a gate pulse generating circuit 21. The outputs from the AND gates 18 and 19 are supplied as the output from the clock edge selecting circuit 16 to a clock detection circuit 23 through an OR gate 22. The synchronism detection circuit 17 detects a sync-signal in the edge pulse a by using a reproducing clock e which is output from the PLL circuit 24, in order to generate a sync-signal detection signal i.- The synchronism detection circuit 17 also outputs the synchronism completion signal h when sync-signal detection signal i that is output successively at a predetermined interval of time reaches a predetermined number. The sync-signal detection signal i which is output from the synchronism detection circuit 17 is supplied to a gate pulse generating circuit 21. The gate pulse generating circuit 21 is arranged to generate, as in the gate pulse generating circuit 7, a gate pulse t of a predetermined length at a predetermined elapsed time after the sync-signal detection signal i- is outputted when the reproducing clock from the PLL circuit 24 is received.

Meanwhile, the output d of the clock edge selecting circuit 16 is supplied to the lock detection circuit 23 and the PLL circuit 24. In the lock detection circuit 23, the output d of the clock edge selecting circuit 16 is supplied to a divide-by-four circuit 25, which is arranged to output a pulse of a predetermined length at a timing of $\frac{1}{4}$ of the output d of the clock edge selecting 16. The output pulse of the divide-by-four circuit 25 is supplied to the reset input terminal of a counter 26. The enable input terminal EN of the counter 26 is supplied with the synchronism completion signal g from the synchronism detection circuit 4 and the clock input terminal of the counter 26 is supplied with the reproducing clock . The counted value of the counter 26 varies gradually with the reproducing clock e and is reset by the falling edge of the output pulse of the divide-by-four circuit 25. The output data of the counter 26 is supplied to a latch circuit 27. the clock input terminal of the latch circuit 27 is supplied with the output pulse of the divide-by-four circuit 25 and the output data of the counter 26 is latched in the latch circuit 27 upon the falling edge of the output pulse of the divide-by-four circuit 25.

The latched value Cx in the latch circuit 27 is compared with the reference value in a comparator circuit 28. The comparator circuit 28 is arranged to output a frequency error signal in accordance with the counter value Cx and to output a lock detection signal k of high level when the count value is greater than $C_A$ and less than $C_B$ (where $C_A < C_S$). The lock detection signal k which is output from the comparator circuit 28 is supplied to the control input terminal of a tri-state buffer 29 and to a phase comparator circuit 33 of the PLL circuit 24.

The buffer 29 opens when the control input is high. The frequency error signal l which is output from the comparator circuit 28 is supplied to the input terminal of the buffer 29. The buffer 29 supplies the frequency error signal i to an LPF 30 in the PLL circuit 24 when the control input is at low level. The phase comparator circuit 33 is arranged to be open when the control input k is low level. The phase comparator 33 in the PLL circuit 24 compares the phases of the output d of the clock edge selecting circuit 16 and the reproducing clock signal of the divide circuit 32, to produce a phase difference signal in accordance with the difference between the two signals. The circuit disclosed in Japanese Patent application No. 59746/87 may be used as the phase comparator circuit 33. The output of the phase comparator 33 is filtered by the LPF 30 and is then supplied as a control signal to the VCO 31. The clock signal having a phase in accordance with the control signal produced by the VCO 31 is divided by two by the divider 32 and then is output as a reproducing clock signal e while also being supplied to the phase comparator circuit 33.

With aforementioned arrangement, when the differentiation edge detection circuit 3 starts to output the edge pulse a upon initiation of readout from the disk, the synchronism with the stable master clock f which is output from the clock generating circuit 15, is quickly detected so as to output the sync-signal detection signal b. When this sync-signal detection signal b is generated a predetermined number of times, the synchronism completion signal is output. When the synchronism completion signal is supplied to the counter 26, the counter 26 initiates a counting operation.

If the PLL circuit 24 for outputting the reproducing clock signal e is not locked, detection of the sync-signal is not effected in the synchronism detection circuit 17, thus no synchronism completion signal h is output. Therefore, in the clock edge selecting circuit 16, the clock edge pulse d- is separated from the edge pulse a using the gate pulse c which is output from the gate pulse generating circuit 7, and the clock edge pulse d is selectively output through the AND gate 18. The clock edge pulse d is supplied to the phase comparator circuit 33 of the PLL circuit 24 to produce the reproducing clock . Also, when the clock edge pulse d is supplied to the counter 26 and the latch circuit 27 after it has been divided by 4 by a divide-by-four circuit 25, the counter data corresponding to the time between the clock edge pulses d (nearly equal to the predetermined length of time) is maintained in the latch 27. Since the clock frequency is 11.1456 MHz, the time period of the clock edge pulse corresponds to 270 clock pulses in the normal state. Further, since the clock signal is divided by four, the count value held in the latch circuit 27 is 1080 ±M. Thus assuming 1077 to 1083 to be a lock range of the PLL circuit 24, the PLL circuit 24 is out of lock if the count value Cx is less than 1077 or greater than 1083.

The count value Cx latched in the latch circuit 27 is compared with a reference value in the comparator 28. Assuming that $C_A=1077$ and $C_B=1083$, the lock detection signal k is output from the comparator circuit 28 to the buffer 29 when the count value Cx is between 1077 and 1083. When the high level of this lock detection signal k is supplied as the control signal to the buffer 29, the buffer 29 does not output the frequency error signal l to the LPF 30.

When a low level signal is supplied to the control input terminal of the buffer 29, the buffer 29 will be in enabled condition, in which case the comparator circuit 28 outputs a low level signal as the frequency error signal l to cause the buffer 29 to output a low level signal when the count value Cx is less than 1077 and outputs a high level as the frequency error signal l to cause the buffer 29 to output a low level signal when the count value Cx is greater than 1083. The output of the buffer 29 is then supplied to the VCO 31 through the LPF 30 to vary the frequency of the VCO 31.

If the lock condition is not detected, i.e., the lock detection signal k is low, the buffer 29 outputs a signal to cause the output of the phase comparator circuit 33 to open. As a result, when the buffer 29 outputs a signal, the PLL circuit 24 is promptly driven to frequencies within its lock range. Also when the phase comparator circuit 33 performs phase comparison between the data clock signal d and the reproducing clock signal e which are different frequencies, the PLL circuit is prevented from mislocking on different spectra since the PLL circuit 24 has a frequency control loop.

Figure 2:
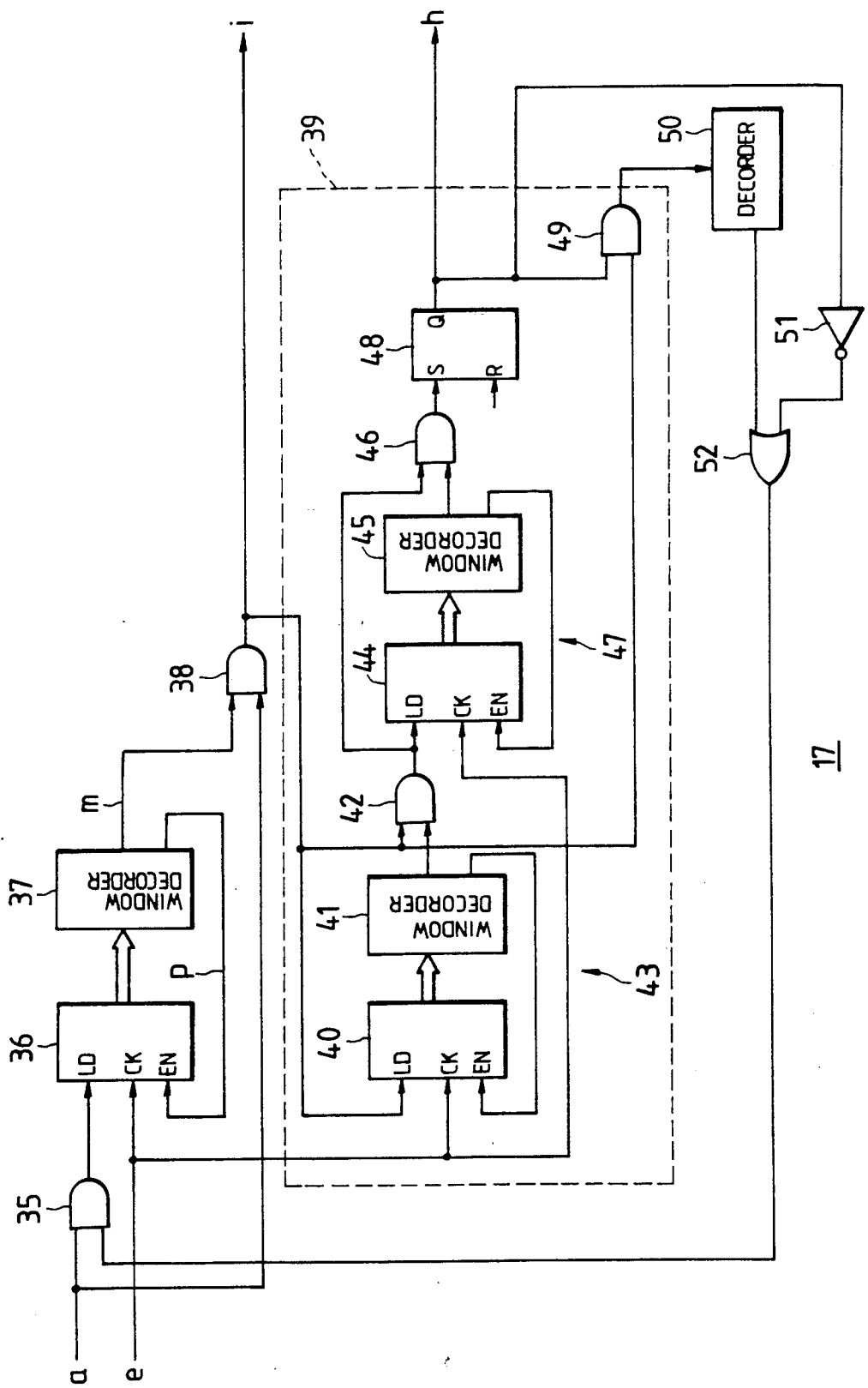
FIG. 2 is a circuit diagram showing specific circuit example of a synchronism detection circuit 17 of a circuit in FIG. 1.
Figure 3:
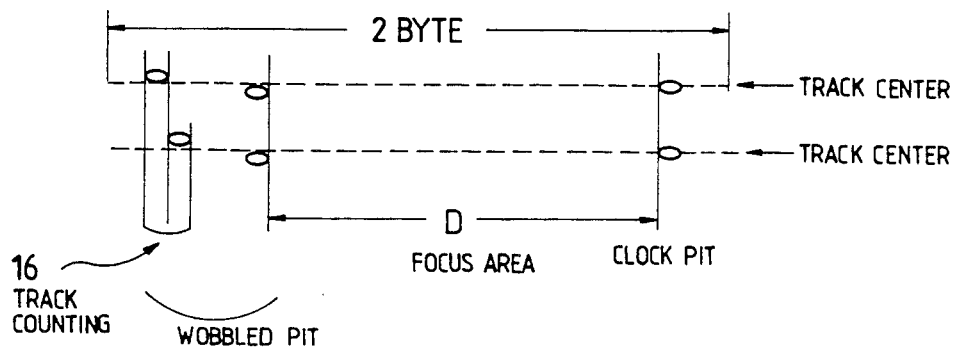
FIG. 3 is a diagram showing servo-byte pattern.

FIG. 2 is a diagram showing a specific example of synchronism detection circuit 17 in FIG. 1. In FIG. 2, the edge pulse a is supplied to a counter 36 through an AND gate 35. When the edge pulse a is supplied to the counter 36, the counter 36 first resets its previous count value and then restarts counting of the reproducing clock e that is input. A windowdecoder 37 outputs a window pulse m for a section (time segment), for example, from 18 (=19−1) to a value in excess of 20 (=19+1) of the count of the counter 36. After the 8th edge pulse a has been input, the AND gate 38 is open when the 12th edge pulse outputting is input, after the 19th clock pulse, thereby outputting the syncsignal detection signal i.

In the case where the time period between two edge pulses is shorter than the time period for 19 clock pulses, the counter 36 is again loaded when the second edge pulse is input to reset the counted value. Also, in the case where the time period the two edge pulses is longer than the time period for the 19th clock pluse, the window decoder 37 outputs an overflow signal to inhibit the counting operation of the counter 36. Then the counter 36 is again loaded when the next edge pulse is input. In a case like this where the time period is different from that of the sync-signal, the sync-signal detection signal i is not output.

This sync-signal detection signal i is supplied to a protection circuit 39, which includes a first circuit 43 consisting of a counter 40, window decoder 41 and an AND gate 42; and a second circuit 47 consisting of a counter 44, window decoder 45 and an AND gate 46; an R-S flipflop 48, and an AND gate 49. The circuits 43 and 47 are arranged basically in the same manner as the circuit consisting of the counter 36, the window decoder 37 and the AND gate 38. The window decoders 41 and 45 are set with respect to 270+1 clock signal count, which is a time period of a servo-byte.

The counter 40 starts to count the reproducing clock signal when the sync-signal detection signal i is supplied from the AND gate 38. The window decoder 41 is arranged to output a window signal of high level when the counted value of the counter 40 is 269, 270 or 271. Thus the AND gate 42 outputs a high level signal when the time period between two successive sync-signal detection signals i is equal to 270 clock pulses.

When a high level signal which is output from the AND gate 42 is supplied to the counter 44, the counter 44 starts counting clock pulses. The window decoder 45 is arranged to output a window signal of high level when the counted value of the counter 44 is 269, 270 or 271. Therefore, the AND 46 outputs a high level signal when two successive outputs of the AND gate 42 are spaced apart by 270 clock pulses. Thus the circuit 47 can decide whether or not the sync-signal having correct space is detected twice successively.

When the high level signal is output from the AND gate 46, the R-S flip-flop 48 is set so that it outputs the synchronism completion signal h at a high level from the Q output terminal thereof. When the flip-flop 48 is set, the synchronism completion signal h is directly output to a decoder 50 from the AND gate 49 to which the Q output of the flip-flop 48 is input. When the synchronism completion signal h- is supplied from the AND gate 49, the decoder 50 outputs a window pulse at the 8th edge pulse of the next servo-byte with respect to a location of the sync-signal. Since the output of an inverter 51 becomes low level when the flip-flop 48 is set, the output of the decoder 50 is supplied to the AND gate 35 through an OR gate 52. Thus, the AND gate 35 passes only the 8th edge pulse and the 12th edge pulse, while the other edge pulses are masked.

As described above, the circuit in FIG. 2 is adapted to mask the edge pulse intermediate sync-signal when the stable sync-signal is detected, and not to mask the edge pulse intermediate sync-signal when stable syncsignal is not detected, for example when starting. Thus it is possible to prevent the problem that data is detected mistakenly as the sync-signal, causing long detection time of the correct sync-signal, and also it is possible to decrease the probability that the sync-signal may not be detected due to pulses resulting from noise and other deficiencies.

The flip-flop 48 is reset by a reset pulse wen initializing, and is arranged not to mask when initializing the intermediate portion (mirror portion) of two edge pulses forming the sync-signal. This is because the data is mistakenly detected as the sync-signal thus requiring a longer time period before correct detection is made if an intermediate portion of the two edge pulses is to be masked during initializing as well.

Also, although the arrangement in FIG. 1 is adapted to supply the master clock f from the clock generating circuit 15 to the circuits for detecting synchronism such as the synchronism detection circuit and the gate pulse generating circuit 7, the free running frequency of VCO 31 can instead be applied directly if the free running frequency of the VCO 31 is aligned to the reference frequency and drift of the frequency due to temperature-change is sufficiently small.

As described above, a clock producing circuit for storing and reproducing data according to the present invention generates a reference clock signal having a predetermined frequency; generates a first sync-signal detection signal when the value measured from the reference clock signal, in the time period between two adjacent pulses in the input signal is equal to a predetermined reference value; separates the clock edge pulse from the input signal by the first sync-signal detection signal and then outputs the clock edge pulse; generates the reproducing clock signal having a predetermined frequency which coincides with the separated clock edge pulse. Thus the sync-signal can also be detected by a stable reference clock signal when starting. Variation of the data or tolerance of rotation of the spindle can be widened for stable starting.

What is claimed is:

1. A clock signal generating circuit for generating a clock signal for use in a data storage and reproduction system, said clock signal having a predetermined frequency in synchronism with clock edge pulses each of which exists at a predetermined location in a sync-signal section having a predetermined length between two adjacent pulses thereof, said clock signal generating circuit comprising:
    a first clock signal generating means for generating a reference clock signal having a predetermined frequency;
    a first synchronism detection means for measuring a time period between the two adjacent pulses in an input signal on the basis of said reference clock signal for said time period and outputting a first syncsignal detection signal when said measured time period is equal to a predetermined value;
    a separation means for separating said clock edge pulses in said input signal in response to said first sync-signal detection signal, and outputting said clock edge pulses; and
    a second clock signal generating means for generating a reproducing clock signal having a predetermined frequency in synchronism with said clock edge pulses which are outputted from said separation means.

2. A clock signal generating circuit for a data storage and reproduction system according to claim 1, wherein said second clock generating means comprises:
    a phase locked loop circuit comprising a phase comparator circuit which compares a phase of said clock edge pulse with a phase of said reproducing clock signal having a frequency different from said clock edge pulse;
    a frequency control circuit which controls the frequency of said reproducing clock signal by supplying said phase locked loop circuit with a signal corresponding to a value obtained from measurement of a time period between adjacent clock edge pulses.

3. A clock signal generating circuit for a data storage and reproduction system according to claim 1, wherein said separation means comprises:
    means for generating a second sync-signal detection signal when measurement of said time period between two adjacent pulses in an input signal by said reproducing clock;
    means for generating a synchronism completion signal when said second sync-signal detection signal is generated successively at a predetermined interval; and
    said separation means separating and outputting the clock edge pulse from said input signal by said second sync-signal detection signal when said synchronism completion signal is present.

* * * * *